(12) United States Patent
Sverdlov

(10) Patent No.: US 6,266,355 B1
(45) Date of Patent: Jul. 24, 2001

(54) GROUP III-V NITRIDE LASER DEVICES WITH CLADDING LAYERS TO SUPPRESS DEFECTS SUCH AS CRACKING

(75) Inventor: Boris N. Sverdlov, San Jose, CA (US)

(73) Assignee: SDL, Inc., San Jose, CA (US)

(*) Notice: Subject to any disclaimer, the term of this patent is extended or adjusted under 35 U.S.C. 154(b) by 0 days.

(21) Appl. No.: 09/151,792

(22) Filed: Sep. 11, 1998

Related U.S. Application Data

(60) Provisional application No. 60/058,768, filed on Sep. 12, 1997.

(51) Int. Cl.[7] .......................................... H10I 5/00
(52) U.S. Cl. ........................ 372/45; 372/45; 372/48; 372/50
(58) Field of Search .................. 372/45, 48, 50

(56) References Cited

U.S. PATENT DOCUMENTS

| | | | |
|---|---|---|---|
| 4,855,249 | 8/1989 | Akasaki et al. | 437/81 |
| 5,146,465 | 9/1992 | Khan et al. | 372/45 |
| 5,290,393 | 3/1994 | Nakamura | 156/613 |
| 5,578,839 | 11/1996 | Nakamura et al. | 257/96 |
| 6,031,858 | * 2/2000 | Hatakoshi et al. | 372/46 |

OTHER PUBLICATIONS

J. Park et al, entitled "Selective–area and lateral epitaxial overgrowth of III–N materials by metal organic chemical vapor deposition" *Applied Physics Letters*, vol. 73, Jul. 20, 1998.

F. Jain and W. Huang "Modeling of optical Gain InGa-N–AiGaN and InxGa1–xN–InyGa1–yN Quantum Well Laser" IEEE Journal of Quantum Electronics, vol. 32, No. 5, May 1996, pp. 859–8864.*

S. Keller, "Growth and Characterization on InGaN/GaN Double Heterostructure, LEDs Grown by MOCVD" IEEE/c Conference on Advanced Concept in 1995, pp. 56–63.*

M.P. Mack, "MOCVD growth of InGaN multiple quantum well LEDS and laser diodes", Compound Semiconductor, 1997 IEEE International Symposium on, 1998, pp. 367–370.*

S. Nakamura, "III–V nitride–based lasers", Laser and Electro–Optics Society Annual Meeting, 1997. LEOS '97 10th Meeting. Conference Proceeding., IEEE, vol. 1, 1996, pp. 70–80.*

* cited by examiner

*Primary Examiner*—Robert H. Kim
*Assistant Examiner*—Delma R. Flores Ruiz
(74) *Attorney, Agent, or Firm*—W. Douglas Carothers, Jr.

(57) ABSTRACT

A Group III-V nitride compound semiconductor light emitting device is constructed without the employing homogeneous layers of AlGaN. Instead of homogeneous AlGaN cladding layers, GaN cladding layers are utilized. Since high temperature growths that accompany the formation of AlGaN layers is no longer required, the stochiometric amount of indium in $In_xGa_{1-x}N$ core layers utilized in the active region may be made greater to achieve better electrical and optical properties in the device. The loss of waveguiding achieved by the higher refractive index layers of AlGaN is compensated by the use of core layers of InGaN on adjacent sides of the active region comprising $In_yGa_{1-y}N$ layer or layers. Other techniques are disclosed utilizing digital alloying of cladding layers comprising GaN/AlN superlattices or $Al_xGa_{1-x}N/Al_yGa_{1-y}N$ superlattices, or growing Group III-V nitride devices on selected regions of the growth surface of the substrates so that large stresses are not produced as would be the case with uniform growth over the entire growth surface of the substrate.

19 Claims, 4 Drawing Sheets

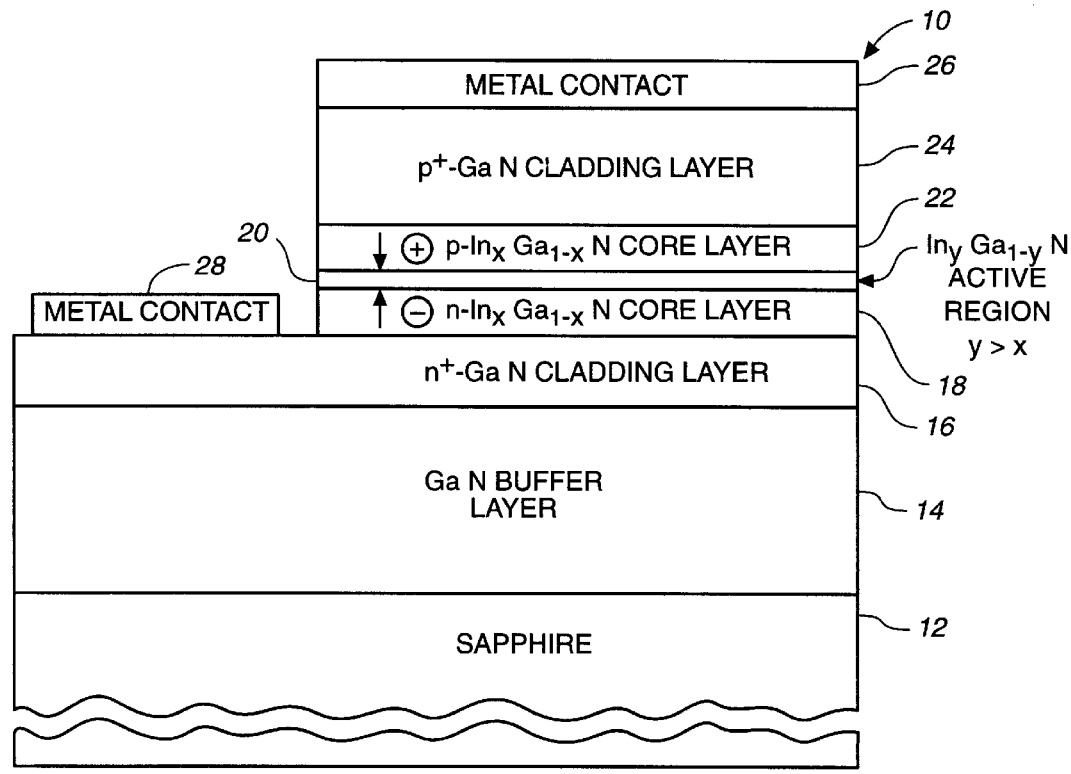
FIG._1
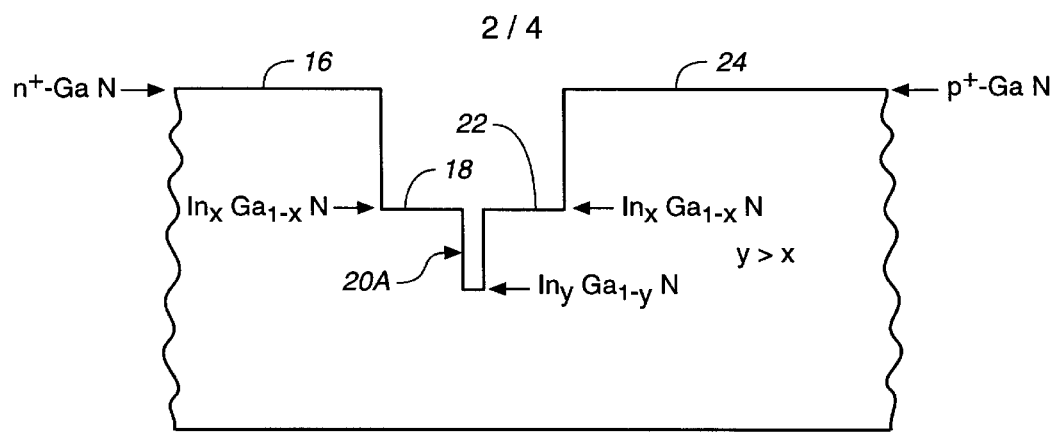
FIG._2

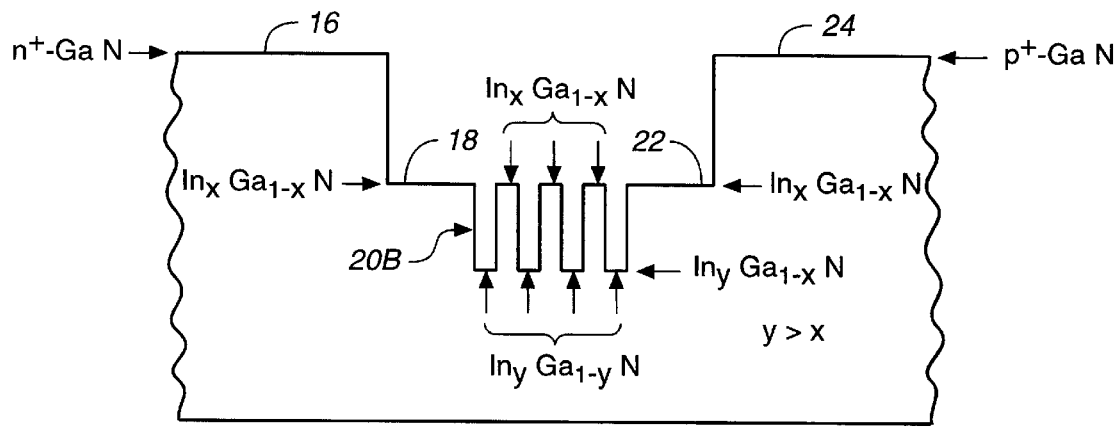
FIG._3
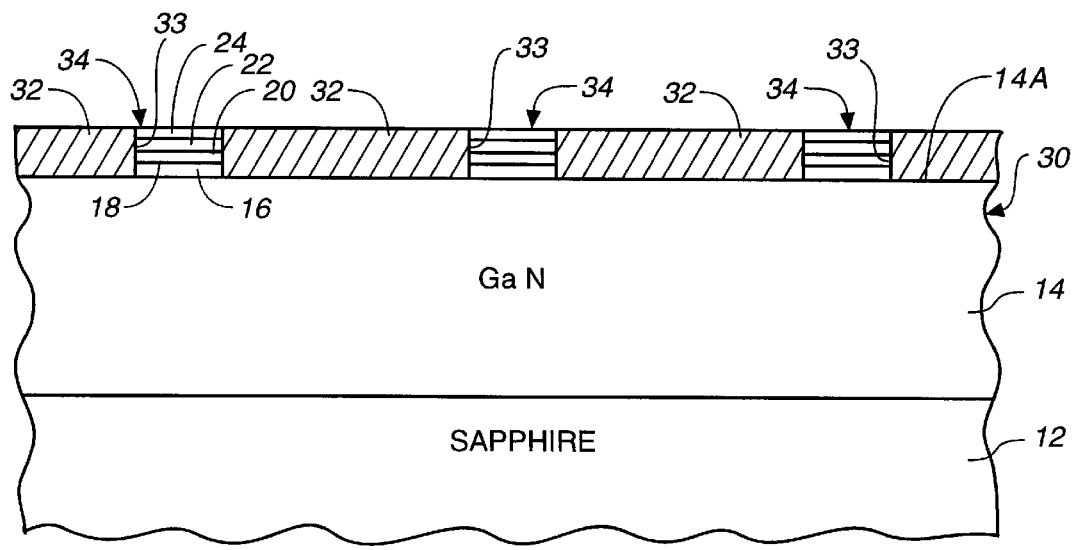
FIG._4

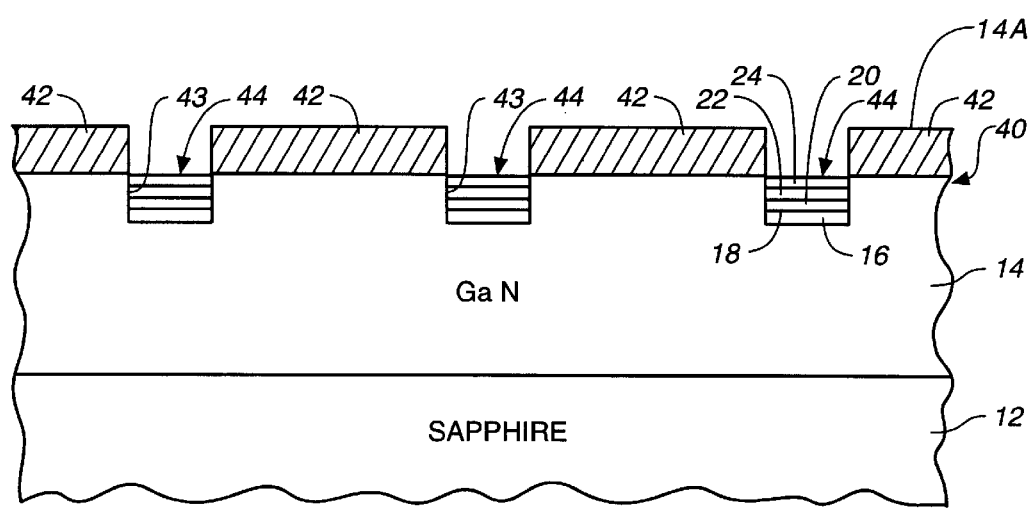
FIG._5
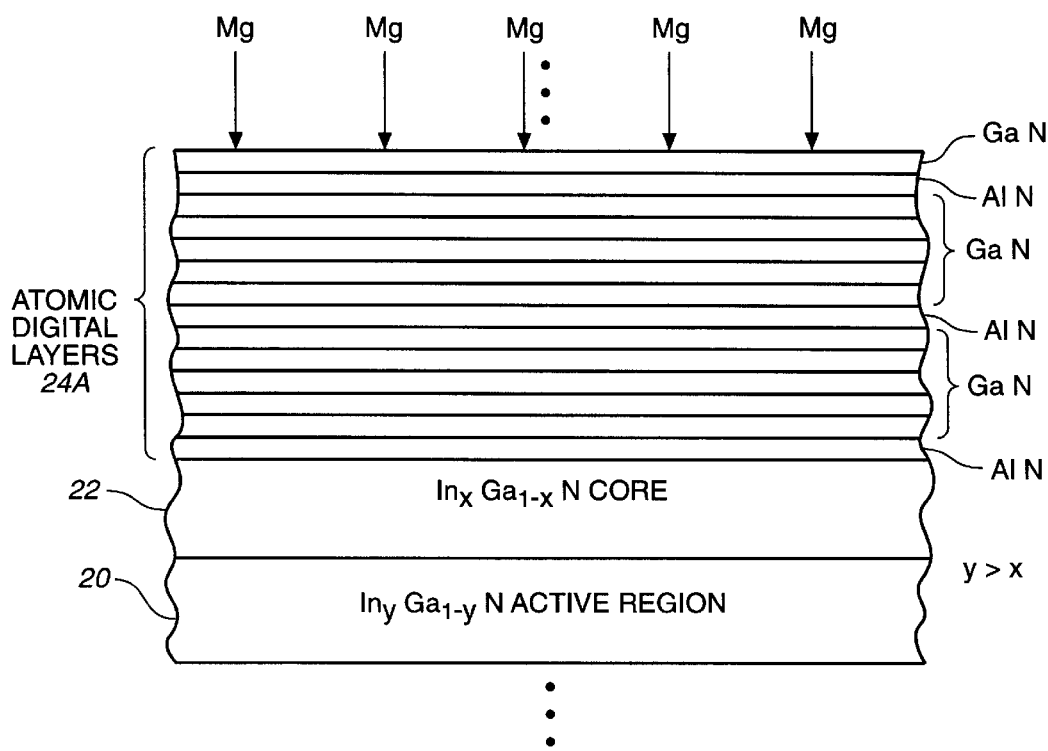
FIG._6

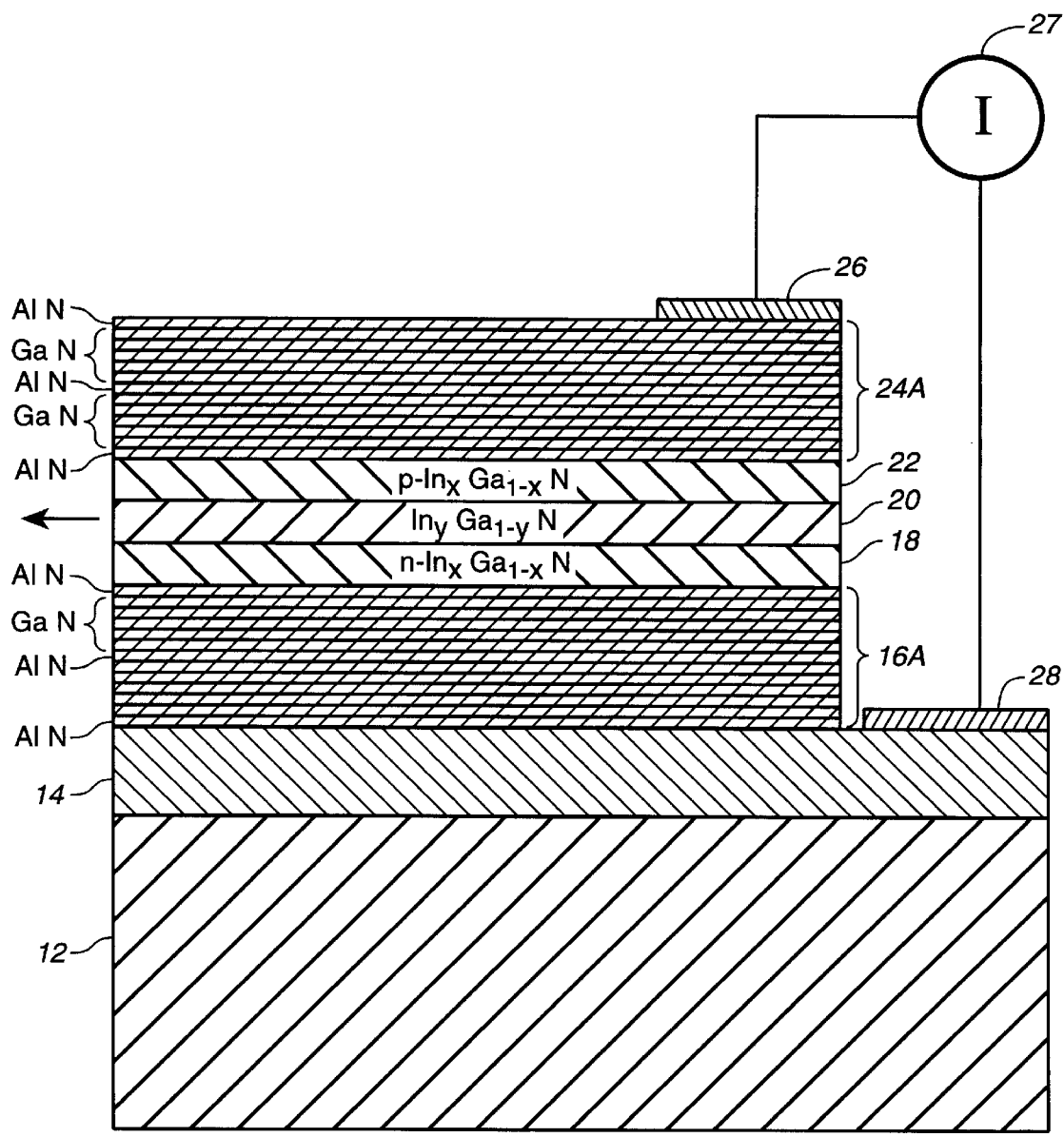
FIG._7

GROUP III-V NITRIDE LASER DEVICES WITH CLADDING LAYERS TO SUPPRESS DEFECTS SUCH AS CRACKING

REFERENCE TO RELATED APPLICATION

This application is a continuation of provisional application, Ser. No. 60/058,768, filed Sep. 12, 1997, which is incorporated herein by its reference.

This invention was made with government support under Contract No. MDA972-95-3-0008, awarded by the DARPA. The government has certain rights in the invention.

FIELD OF THE INVENTION

This invention relates generally to Group III-V nitride compound semiconductor devices and more particularly to Group III-V nitride compound semiconductor LED and laser devices utilizing techniques relative to the nitride cladding layers to suppress defects such as layer cracking. By "layer cracking", it meant that cracks appear or are generated through as-grown Group III-V nitride compound layers transversely of their layer planes during the growth of the layers.

BACKGROUND OF THE INVENTION

Group III-V nitride compound semiconductor laser devices illustrated to date that have operated for prolonged periods of time, particularly as reported by Shuji Nakamura and his coworkers, have employed AlGaN. An example of the growth of AlGaN layers is exemplified in the U.S. Pat. No. 5,290,393 to Nakamura. Such AlGaN layers are grown in MOCVD at temperatures between 900° C. and 1200° C. Upon heating and cooling sequences in the MOCVD fabrication of devices, the as-grown layers are subjected to tremendous stresses since the AlGaN layers do not expand or contract at the same rate as the sapphire substrate, their thermal expansion coefficients being so different. As a result, large and small micro-cracks form in such as-grown layers that spread from the sapphire substrate upward through the layers. While the mechanisms causing these cracks are not fully understood, they are likely caused by the thermal expansion coefficient mismatch between the as-grown materials which do not expand or contract at the same rate as the substrate. It was also repeatedly shown that there are two factors severely aggravating cracking in nitride-based structures: presence of thick (e.g. >0.2 $\mu$m) layers of AlGaN and/or doping with both p- and n-type impurities. The higher temperature heating of the substrate during AlGaN layer growth and the subsequent cooldown places the as-grown layers on the substrate under mechanical and lattice stresses upon their contraction at room temperature.

In a Group III-V nitride laser device, the structure may be of the so-called separate confinement type, such as, comprising an InGaN active layer or quantum well or a multiple quantum well region of InGaN quantum wells with InGaN or GaN barriers, cladded between GaN waveguide (or core) layers which in turn are cladded by confinement layers of p-type and n-type AlGaN. The general requirement of the separate confinement structure: step-like increase of band gap and corresponding decrease in refractive index from the active layer through waveguide layers to confinement (or cladding layers) is satisfied in this case.

As Al is added to or increased in $Al_xGa_{1-x}N$, the growth temperature for growing the layer has to be correspondingly increased. Because of these high temperatures, diffusion can occur within the InGaN active region. InGaN is grown at much lower temperatures, such as in the range of about 600° C. to about 800° C. These higher growth temperatures for AlGaN, such as in the case of growing the upper p-type AlGaN layer at 1,000° C. or more, will heat up the InGaN layer or layers and can induce atomic rearrangement in these layers. The indium can start clustering at Group III lattice sites through the process of elemental interdiffusion. While not well understood, it is believed that when the InGaN layer is initially grown, the In and Ga atoms which are randomly distributed on the Group III lattice sites, forming a homogenous alloy. When the InGaN layer is subjected later to higher temperatures, particularly well above its growth temperature range, there is an exchange and redistribution of In and Ga atoms at the Group III sites. It could be an equilibrium condition comprising an InN-rich region and a GaN-rich region. Equilibrium is suppressed by growing the InGaN layer at low temperatures so that a homogeneous mix of In and Ga in the lattice structure is achieved. In any case, when the InGaN layer or layers are heated to temperatures in excess of its growth temperature range, InN-rich and GaN-rich clusters can form in the as-grown InGaN layer or layers, causing their desired optical properties to be substantially deteriorated.

In spite of these above mentioned problems, AlGaN layers are the present choice for blue LED and laser devices because they can provide both good electrical and optical confinement particularly if the above described problems can be overcome on a regular high-yield basis.

It is an object of this invention to provide a Group III-V nitride compound semiconductor light emitting device, such as Group III-V nitride lasers and LED's, that eliminates the foregoing problems by avoiding the use of homogeneous AlGaN or the extensive use of aluminum nitride in the fabrication of these types of devices and provide cladding layers that are designed with the objective of suppressing interlayer cracking.

SUMMARY OF THE INVENTION

According to this invention, a Group III-V nitride compound semiconductor light emitting device is constructed without employing homogeneous layers of AlGaN. Instead of homogeneous AlGaN cladding layers, GaN cladding layers are utilized. Since high temperature growths that accompany the formation of AlGaN layers are no longer required, the stochiometric amount of indium in $In_xGa_{1-x}N$ of core layers utilized in the active region may be made greater to achieve better electrical and optical properties in the device. Thus, the loss of waveguiding achieved by the lower refractive index layers of AlGaN is compensated by the use of core layers of InGaN on adjacent sides of the active region.

In one embodiment of this invention, a method of manufacturing comprises a Group III-V, aluminum-free nitride compound semiconductor device utilizing MOCVD comprising the steps of growing a n-GaN cladding layer on a substrate, growing a core layer of $In_xGa_{1-x}N$ on the n-GaN cladding layer, growing an active region on the core layer containing at least one layer of $In_yGa_{1-y}N$ where y>x, growing another core layer of $In_xGa_{1-x}N$ on the active region, and growing a p-GaN cladding layer on the core layer of $In_xGa_{1-x}N$. The stochiometric amount of indium in $In_xGa_{1-x}N$ core layers utilized in the active region may be made greater to achieve better electrical and optical properties in the device.

In another embodiment of this invention the cladding layers are grown by digital alloying, such as digital alloying growth of cladding layers comprising monolayers of GaN and AlN forming a GaN/AlN superlattice. Digital alloying in these layers provides for higher doping concentrations, which is due to the ease of doping interdigitated GaN layers rather than homogeneous AlGaN layers as well as suppressing the formation of defects such as cracks in the formed layer or layers. Also, the inclusion of some aluminum in the cladding layers provides for improved optical confinement over just pure GaN. Digital alloying of the cladding layers is commenced with the growth of a monolayer of AlN followed by a plurality of GaN monolayers followed by another AlN layer and so on. There are several times more GaN monolayers than AlN monolayers in the cladding layers. For example, the ratio of GaN monolayers to AlN monolayers may be about 4:1 or 5:1. Also, digital alloying can be extended to $Al_xGa_{1-x}N/Al_yGa_{1-y}N$ superlattices in the formation of the cladding layers.

In another embodiment of this invention the steps of growth, set forth above, are carried out in different spatial regions on the substrate. The spatial region growth may be carried out through the employment of photolithography on a surface of the substrate, such as by means of forming grooves in a dielectric layer formed on a surface of the substrate in which the nitride layered structure of the first mentioned embodiment can be grown in the grooves by means of MOCVD. Patterned photoresist via photolithography is employed to form the spatial pattern in a deposited dielectric, such as $SiO_2$ or $Si_3N_4$, or the photoresist can used to form a pattern of grooves or ridges in the buffer layer. In either case, the Group III-V nitride layers forming the laser devices can be grown per the first mentioned embodiment via MOCVD in formed spatial regions on the substrate. All of these spatial growth techniques eliminate the development of mechanical and lattice induced stresses over large substrate surface areas wherein growth in spatial regions on the substrate will be over small discrete areas too small in size to allow the formation of cracks. Thus, rows of Group III-V light emitting devices are formed in a spatial manner across the substrate which will result in a high yield of operable devices. To eliminate cracking along the length of extend rows, the photolithography may be patterned to form two-dimensional regions or areas too small in size to allow the formation of layer cracking within the contained small areas of Group III-V nitride growth.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a schematic diagram of a first embodiment of a Group III-V nitride compound semiconductor light emitting device according to this invention.

FIG. 2 is band gap profile according to one version of the device shown in FIG. 1.

FIG. 3 is band gap profile according to another version of the device shown in FIG. 1.

FIG. 4 is a schematic diagram of a second embodiment of a Group III-V nitride compound semiconductor light emitting device according to this invention.

FIG. 5 is a schematic diagram of a third embodiment of a Group III-V nitride compound semiconductor light emitting device according to this invention.

FIG. 6 is an illustration of a portion of a fourth embodiment of this invention having cladding layers comprising atomic digital layers.

FIG. 7 is a schematic diagram of a complete structure of the fourth embodiment of a Group III-V nitride compound semiconductor light emitting device according to this invention.

DETAILED DESCRIPTION OF THE PREFERRED EMBODIMENTS OF THE INVENTION

Reference is now made to FIG. 1 comprising a Group III-V nitride compound semiconductor light emitting device 10 according to this invention. Device 10 is fabricated using MOCVD and comprises a sapphire substrate 12 upon which is formed buffer layer 14 of GaN, which may be 2 μm to 3 μm thick, followed by cladding layer 16 of $n^+$-GaN, an $In_yGa_{1-y}N$ active region 20A sandwiched by core layers comprising layers 18 and 22, and cladding layer 24 of $p^+$-GaN. Active region 20A may be comprised of an undoped $In_yGa_{1-y}N$ active region 20 surrounded by core layers 18 and 22 respectively of n-$In_xGa_{1-x}N$ and p-$In_yGa_{1-y}N$ where y>x. Active region 20 may be, alternatively, doped n-typed (e.g., Si), but an undoped region is preferred. Core layers 18 and 22 are effective for the gathering of electrons and holes which then flow into active region 22 were they recombine to form photons. To have high carrier collection efficiency, band gap of core layers 18, 22 should be smaller than that of cladding layers, and band gap of active layer should be, in turn, smaller than that of the core layers. The band gap of the InGaN alloy decreases with an increase of In. Thus, a certain amount molar fraction, x, of In in core layers produces an alloy with the band gap smaller than GaN and amount of In y>x in the active layer produces an alloy with band gap smaller than in core layers. In the embodiment shown, the molar fraction of y in $In_yGa_{1-y}N$ may be in the range of about 0.1 to 0.25, and the molar fraction of x in layers 18 and 22 of $In_xGa_{1-x}N$ may be in the range of about 0.03 to 0.15. Also, core layers 18 and 22 provide for optical confinement and provide a mechanism for shaping the spatial mode. In cases where the active region is thin, e.g., such as a single layer 22, the Gaussian beam shape would be of broad lateral extent. However, core layers 18 and 22 provide for a more narrow and confined Gaussian beam shape. This is one of the important features of this invention. Since cladding layers 16 and 24, that are conventionally AlGaN, are being replaced by higher refractive index layers of GaN, there is less confinement of the spatial mode. However, the relaxation of such optical confinement is taken up by the optical confinement provided by the yet higher refractive index of the InGaN core layers 18 and 22. Since the higher growth temperature AlGaN cladding layers are replaced with the lower growth temperature GaN cladding layers, the fear of clustering in the InGaN layers is significantly alleviated and, the stochiometric amount of indium in $In_xGa_{1-x}N$ in core layers 18 and 22 can be increased to achieve better optical confinement of the single spatial mode. Device 10 is completed with metal contacts 26 and 28 respectively applied to $p^+$-GaN cladding layer 24 and $n^+$-GaN cladding layer 16.

GaN cladding layers 16 and 22 are also easier to provide for higher impurity concentration, particularly p impurity doping of GaN where impurity concentrations higher than $10^{18}$ can be more easily be achieved than in the case of $p^+$-dopinig of AlGaN. FIG. 2 shows the band gap profile for device 20 of FIG. 1 with a single quantum well 20A comprising $In_yGa_{1-y}N$ having a thickness, for example, in the range of about 20 Å to about 100 Å. FIG. 3 shows the index profile for device 20 of FIG. 1 with a multiple quantum well structure 20B comprising $In_yGa_{1-y}N$ wells and $In_yGa_{1-y}N$ barriers. The wells and barriers may have a thickness, for example, in the range of about 20 Å to about 150 Å. The thickness of core layers 18 and 22 depends upon the geometry of the structure and the desired optical gain but, in general, may be somewhere in the range of about 500 Å to 1,000 Å. Cladding layers 16 and 24 are thicker to provide for optical confinement such as in the range, for example, of about 1,000 Å to 5,000 Å. Thus, the prime feature of this embodiment of the invention is the use of GaN cladding layers, instead of AlGaN cladding layers grown in the temperature range of about 1,000° C. to 1,100° C., which are currently favored by others in pursing Group III-V nitrides for producing blue light diode lasers. However, GaN will help evade the problem of cracking since GaN has a lower growth temperature range, such as in the range of about 800° C. to 1,050° C., and will not, particularly in the case of the growth of layer 24, change the microstructure of the underlying InGaN core/active region, such as causing In-rich and Ga-rich clustering.

GaN confinement layers cannot provide the same level of optical confinement as AlGaN layers. However in spite of any improvements achieved for optical confinement with the use of AlGaN cladding layers, the problem of cracking caused with the use of this material lends creditable consideration to the employment of GaN as cladding layers. It is particularly important that because of lack of cracking, GaN p-cladding layer 24 may be made sufficiently thick (more than 1 (m) to compensate for lower optical confinement as compared with AlGaN. Moreover, since n-confinement layer 16 and buffer layer 14 are essentially of the same material—GaN, the suggested structure does not encounter a problem known for AlGaN based structures, which is the leaking of the waveguide mode through n-AlGaN cladding layer into GaN buffer layer. In addition, the employment of InGaN core layers 18 and 22 may enhance optical confinement of the spatial mode for certain InGaN compositions even over that achievable with AlGaN cladding layers. As an example, the stochiometric amount of indium in $In_xGa_{1-x}N$ in core layers 18 and 22 to achieve this enhance optical confinement is at the high end of the range previously given for these layers, e.g., around 15%.

FIG. 4 illustrates another or second embodiment of this invention which also alleviates the problem of layer cracking in order to produce crack-free devices. In this embodiment structure 30, comprising sapphire substrate 12 and buffer layer 14, is utilized for the purpose of providing a spatial growth surface which is patterned on the buffer layer surface 14A. After the MOCVD growth of buffer layer 14, structure 30 is removed from the MOCVD reactor and a dielectric layer 32 is formed on buffer layer 14, such as a layer of $SiO_2$ or $Si_3N_4$. Then, a photoresist layer (not shown) is formed on the surface of dielectric layer 32. A patterned exposure is made of the photoresist followed by removal of exposed portions, and etching dielectric in open portions of the photoresist, as is well known in the art, forming a series of grooves 33 in dielectric layer 32. After removal of the remaining photoresist, the substrate surface is cleaned and then growth in the MOCVD reactor is continued with the growth of Group III-V nitride layers 14–24 (as disclosed in FIGS. 1–3) on the patterned layer 32, this growth being accomplished in a manner as previous explained in connection with the first embodiment. After completion of growth, removal of the remaining portions of layer 32 are accomplished with an appropriate solvent, such as, for example, buffered oxide etch (BOE). What results is a series of rows of patterned nitride growth which can be finished after dicing into a plurality of Group III-V nitride laser devices 34 after ohmic contacting has been accomplished. The advantage of this patterned growth approach is that, since the Group III-V nitride growth is not contiguous over the entire surface of structure 30, there is no build up over the larger area of the substrate of stresses such as possibly due to thermal expansion coefficient differences of materials, effects of any lattice mismatch, and the effects of heating, cooling or otherwise changes in reactor temperatures occurring over a large area of MOCVD growth. This advantage in combination with the utility disclosed in the first embodiment provides for the growth of superior device that are crack-free. By breaking up of the growth of multiple semiconductor layers over the substrate surface into spatial rows, the formed stresses are of significantly less amount and are suppressed since the area of MOCVD device growth is comparatively small.

While the foregoing embodiment in FIG. 4 relates to formation of rows of MOCVD patterned structures which can be diced into plural individual laser devices, the patterning can also be made into patterned two-dimensional isolated regions rather than in patterned grooves or rows. This provides the further advantage of reducing stresses in Group III-V nitride growth in two dimensions rather just one dimension. In this case, after completion of the regional growth of layers 14–24, contacting is performed, the patterned dielectric layer 32 is removed, and the regions of growth diced from the wafer to form individual laser devices or die of several laser devices which are thereafter heatsink mounted for operation and testing.

The size of the special regions, whether one-dimensional or two-dimensional, should not be larger than about 15 $\mu$m in width. It is preferred that the dimension be smaller than 15 $\mu$m. Of course, in the case of two-dimensional discrete, spatial regions, the length must be of sufficient to form operable light emitting devices such as at least in the broad range of 300 $\mu$m to 1 mm.

In FIG. 5, the third embodiment of this invention is illustrated at 40, which is the same as the second embodiment in FIG. 4 except that, instead of forming patterned devices on surface 14A of buffer layer 14 of the substrate, grooves 43 are preferentially etched into buffer layer 14 employing patterned dielectric layer 42 using photolithography, as in the case used in the previous embodiment. The patterned dielectric layer 42 remains on substrate 12 and the substrate 30 is cleaned and then placed in a MOCVD reactor for continued growth of layers 14–24 in a manner as previous explained. After growth, the remaining portions of dielectric layer 42 are removed leaving spatial one dimensional rows or two dimensional regions, according to the case of patterning that is used, forming as-grown Group III-V nitride laser devices 44 for dicing and further processing. It is within the scope of this embodiment to form ridges in the surface of buffer layer 14 between which rows of Group III-V nitride devices 44 are formed according to the preceding description.

While the third embodiment has been explained in conjunction with the use of GaN cladding layers 16 and 24, it is important to point out that these cladding layers 16 and 24 in the embodiments of FIGS. 4 and 5 may also be AlGaN since the thermal stresses developed over a growth surface comprising the entire substrate have been significantly reduced by growth on the growth surface of substrates 30 or 40 confined to selected regions of their surfaces. While possibility of clustering may be encountered with the use of AlGaN cladding layers 16 and 24, the magnitude of clustering in underlying InGaN layers can be suppressed with a very thin (e.g., 200 Å thick) AlGaN layer of high Al content (e.g., in the range of about 20% to about 25%) on the $In_xGa_{1-x}N$ core layer 22, which thin layer acts as a seal of the underlying core layer preventing any substantial clustering of the Ga and In in that layer. While the high Al content thin layer may affect to some extent the electrical and optical properties of the resulting laser device, alternatively, it is believed that, in the absence of such a sealing layer, the surface and layer kinetics of such small spatial areas of group III-V nitride growth, such as in the micron range of a few microns to several hundred microns, are possibly sufficiently different, as compared to the case of growth of these nitride layers over the entire wafer, that the magnitude of In-Ga clustering in the InGaN layers is significantly reduced.

Reference is now made to FIGS. 6 and 7 disclosing a fourth embodiment of this invention. In this embodiment, cladding layers 16 and 24 comprise digital alloying comprising atomic layering of alternating monolayers or groups of such monolayers layers or different combinations of such layers of GaN-rich and AlN-rich monolayers. Single or multiple monolayers of these different layers are possible. It is believed that the application of digital alloying has not been previously applied to Group III-V nitrides, particularly to non-homogenous layering of AlGaN. As shown in FIG. 6, AlGaN may be employed in the form of atomic layering using atomic layering growth in the MOCVD reactor. In the embodiment shown in FIG. 6, for every monolayer of AlN grown, a group of GaN monolayers are grown, here shown in a ratio of 1 to 5 or any other suitable ratio to provide a desired average composition of the material. As a result, a GaN/AlN superlattice is formed for cladding layer 24. Doping, such as Mg from the reactant gas, $Cp_2Mg$, is introduced into the MOCVD reactor during the growth of the monolayers of AlN and/or GaN. The application of atomic layering of cladding layer 24A in FIG. 6 is believed to suppress cracking. Moreover, since it is easier to achieve higher concentrations of the p-dopant in GaN as compared to a homogenous layer of AlGaN, it is believed that the use of atomic layering permits the incorporation of higher levels of p-dopant, particularly in the GaN monolayers, which are many times more numerous than the AlN monolayers. At least more dopant will be introduced during the growth of the monolayers of GaN. In addition, doping only of GaN monolayers during their growth also alleviates layer cracking.

In the growth of the monolayer cladding structure 24A in FIG. 6, the process is started with AlN, followed by several monolayers of GaN before the growth of another AlN monolayer and would comprise no more than one such layer, after which the process is repeated again. The ratio of a GaN monolayers to AlN monolayers is in the range of 3:1 to 6:1, preferably in the range, for example, of 4:1 to 5:1.

FIG. 7 shows the complete structure of InGaN/GaN light emitting device according to the embodiment of FIG. 6 wherein cladding structures 16A and 24A are both formed by digital alloying. The layered structure of FIG. 7 is the same as that shown in FIG. 1 except for the construction of digital alloyed cladding layers 16A and 24A. Layer 16A starts with a AlN monolayer, followed by several monolayers of GaN, followed by another AlN monolayer followed by several more monolayers of GaN and ending with a monolayer AlN, after which growth is continued with core layer 18 of n-InGaN. During the growth of digital alloyed layer 16A, an n-type dopant is introduced, such as Si from the gaseous reactant saline ($SiH_4$) at least during the growth of the GaN monolayer sets of the structure. In reality, many more alternating monolayer groups of AlN and GaN would be grown to produce a sufficiently thick cladding but, for simplicity of illustration, only a few of such monolayer groups are shown here. During the formation of digital alloying of layer 16A, the non-homogenous layer is doped with high concentrations of n-type dopant, such as Si from the gaseous reactant, $SiH_4$. After the growth of p-InGaN core layer 22, digital alloying is reinitiated for the growth of cladding layer 24A in a manner explained in connection with FIG. 6. Layer 24A starts with a AlN monolayer, followed by several monolayers of GaN, followed by another AlN monolayer followed by several more monolayers of GaN and ending with a monolayer AlN. Again, in reality, many more alternating monolayer groups of AlN and GaN would be grown to produce a sufficiently thick cladding but, for simplicity of illustration, only a few of such monolayer groups are shown here. During the formation of digital alloying of layer 24A, the non-homogenous structure, or at least the GaN monolayer sets in the structure, is doped with high concentrations of p-type dopant, such as Mg from the gaseous reactant, $Cp_2Mg$. After substrate processing, contacts 26 and 28 are applied to layers 24A and 14, respectively, and a blue light-emitting laser diode is complete. Current, I, from source 27 is applied with the diode producing blue light from its active region.

It should be noted that, in the embodiment of FIGS. 6 and 7, alternatively, thick superlattice of monolayers of $Al_xGa_{1-x}N/Al_yGa_{1-y}N$, where x>y, may be formed as cladding layers 16 and 24, respectively doped $n^+$ and $p^+$. The Al-containing nitride superlattice cladding layers provide for good optical confinement as well as are believed to suppress the development of cracking providing for higher yields of InGaN/AlGaN laser diodes. In this embodiment, core layers 18 and 22 are not necessary but could be utilized, particularly if the growth of thicker AlGaN superlattices is to be avoided.

Although the invention has been described in conjunction with one or more preferred embodiments, it will be apparent to those skilled in the art that other alternatives, variations and modifications will be apparent in light of the foregoing description as being within the spirit and scope of the invention. For example, the methods disclosed herein to eliminate cracking, particularly in the cladding layers can also be utilized in the manufacture of light emitting devices, such is light emitting diodes (LEDs). Thus, the invention described herein is intended to embrace all such alternatives, variations and modifications that may fall within the spirit and scope of the following claims.

What is claimed is:

1. A Group II-V nitride compound semiconductor device comprising a substrate on which is formed an active region of at least one $In_yGa_{1-y}N$ active layer sandwiched by core layers of $In_xGa_{1-x}N$ where y>x; said active region sandwiched by cladding layers comprising p-GaN and n-GaN; and a plurality of said devices are made in spatial regions on said substrate, rather than in a contiguous manner across said substrate to reduce the formation of interlayer cracks during the manufacture of the devices.

2. The Group III-V nitride compound semiconductor device of claim 1 wherein said device comprises a light emitting laser diode or a LED.

3. The Group III-V nitride compound semiconductor device of claim 1 wherein said devices are formed in grooves on a surface of said substrate.

4. The Group III-V nitride compound semiconductor device of claim 1 wherein said devices are formed in spatial rows on a surface of said substrate using photolithographic processing.

5. A Group III-V nitride compound semiconductor device comprising a substrate on which is formed an active region of at least one $In_yGa_{1-y}N$ active layer sandwiched by core layers of $In_xGa_{1-x}N$ where y>x; said active region sandwiched by cladding layers comprising p-GaN and n-GaN; said cladding layers are formed via digital alloying employing a superlattice of monolayers of GaN and AlN or a superlattice of monolayers of $In_xGa_{1-x}N/In_yGa_{1-y}N$ where x>y.

6. The Group III-V nitride compound semiconductor device of claim 5 wherein there are several times more GaN monolayers than AlN monolayers in said superlattice cladding layers.

7. The Group III-V nitride compound semiconductor device of claim 5 wherein the ratio of GaN monolayers to AlN monolayers is in the range of about 3:1 to 3:1.

8. The Group III-V nitride compound semiconductor device of claim 7 wherein the ratio of GaN monolayers to AlN monolayers is around 4:1 or 5:1.

9. The Group III-V nitride compound semiconductor device of claim 1 wherein a buffer layer of GaN is formed on said substrate, said substrate comprising sapphire.

10. A Group III-V nitride compound semiconductor device comprising a substrate on which is formed an active region of at east one $In_yGa_{1-y}N$ active layer sandwiched by core layers of $In_xGa_{1-x}N$ where y>x said active region sandwiched by cladding layers comprising p-GaN and n-GaN; said device is formed in a spatial region on said substrate to reduce the formation of layer cracks during the growth of said device.

11. The Group III-V nitride compound semiconductor device of claim 10 wherein a plurality of said devices are formed in spatial regions on said substrate to reduced the formation of layer cracks during the growth of said devices.

12. The Group III-V nitride compound semiconductor device of claim 10 wherein said cladding layers are formed via digital alloying employing a superlattice of monolayers of GaN and AlN or a superlattice of monolayers of $Al_xGa_{1-x}N/Al_yGa_{1-y}N$ where x>y.

13. The Group III-V nitride compound semiconductor device of claim 12 wherein there are several times more GaN monolayers than AlN monolayers in said superlattice cladding layers.

14. The Group III-V nitride compound semiconductor device of claim 12 wherein the ratio of GaN monolayers to AlN monolayers is in the range of about 3:1 to 6:1.

15. A Group III-V nitride compound semiconductor device comprising a substrate on which is formed an active region of at least one $In_yGa_{1-y}N$ active layer sandwiched by core layers of $In_xGa_{1-x}N$ where y>x; said active region sandwiched by cladding layers comprising p-AlGaN and n-AlGaN, a plurality of said devices formed in spatially isolated regions patterned either in one dimension or in two dimensions on said substrate to reduce the formation of layer cracks during the manufacture of the devices.

16. The Group III-V nitride compound semiconductor device of claim 15 wherein said devices are formed in spatially separated grooves formed in a patterned dielectric layer on a surfaces of said substrate.

17. The Group III-V nitride compound semiconductor device of claim 15 wherein said devices are formed in spatially separated grooves formed in a surface of said substrate.

18. A Group III-V nitride compound semiconductor device comprising a substrate on which is formed an active region of at least one $In_yGa_{1-y}N$ layer sandwiched by cladding layers comprising a superlattice of monolayers of GaN and AlN or a superlattice of monolayers of $Al_xGa_{1-x}N/Al_yGa_{1-y}N$ where x>y.

19. The Group III-V nitride compound semiconductor device of claim 18 wherein said device comprises a light emitting laser diode or a LED.

* * * * *

UNITED STATES PATENT AND TRADEMARK OFFICE
CERTIFICATE OF CORRECTION

PATENT NO.      : 6,266,355 B1
DATED           : July 24, 2001
INVENTOR(S)     : Boris N. Sverdlov It is certified that error appears in the above-identified patent and that said Letters Patent is hereby corrected as shown below:

Column 8,
Line 47, "II-V" should be -- III-V --.

Signed and Sealed this

Eighteenth Day of March, 2003

JAMES E. ROGAN
*Director of the United States Patent and Trademark Office*